(12) United States Patent
Yun et al.

(10) Patent No.: US 9,362,346 B2
(45) Date of Patent: Jun. 7, 2016

(54) ORGANIC LIGHT EMITTING DISPLAY DEVICE INCLUDING A PLURALITY OF POWER LINES

(71) Applicant: LG Display Co., Ltd., Seoul (KR)

(72) Inventors: Soon Il Yun, Paju-si (KR); Chang Ho Oh, Seoul, OH (US); Ji Yeon Kang, Seongnam-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 14/559,697

(22) Filed: Dec. 3, 2014

(65) Prior Publication Data
US 2015/0171155 A1   Jun. 18, 2015

(30) Foreign Application Priority Data
Dec. 18, 2013   (KR) .................. 10-2013-0158267

(51) Int. Cl.
*H01J 1/62* (2006.01)
*H01L 27/32* (2006.01)
*H01L 51/52* (2006.01)

(52) U.S. Cl.
CPC ........ *H01L 27/3276* (2013.01); *H01L 27/3258* (2013.01); *H01L 51/5237* (2013.01); *H01L 51/5243* (2013.01)

(58) Field of Classification Search
CPC ............ H01L 27/3276; H01L 51/5243; H01L 51/5237; H01L 27/3258
See application file for complete search history.

(56) References Cited

U.S. PATENT DOCUMENTS

| 2012/0025229 | A1 | 2/2012 | Lee et al. |
| 2012/0133278 | A1 | 5/2012 | Ryu |
| 2012/0168779 | A1 | 7/2012 | Lee |

*Primary Examiner* — Joseph L Williams
(74) *Attorney, Agent, or Firm* — Fenwick & West LLP

(57) ABSTRACT

Disclosed is an organic light emitting display device that includes a first substrate; at least one pixel formed on the first substrate; a first power line formed on the first substrate, the first power line supplying a first voltage to the pixel; a second power line formed on the first substrate, the second power line supplying a second voltage to the pixel, the second voltage being different from the first voltage; and a second substrate formed over the first substrate, the second substrate including a first metal layer, a second metal layer, and an insulating layer formed between the first metal layer and the second metal layer, the insulating layer insulating the first metal layer and the second metal layer from each other, wherein the first metal layer is electrically connected with the first power line and the second metal layer is electrically connected to the second power line.

20 Claims, 12 Drawing Sheets

ORGANIC LIGHT EMITTING DISPLAY DEVICE INCLUDING A PLURALITY OF POWER LINES

CROSS REFERENCE TO RELATED APPLICATIONS

This application claims the benefit of Korean Patent Application No. 10-2013-0158267 filed on Dec. 18, 2013, which is hereby incorporated by reference in its entirety.

BACKGROUND

1. Field of the Disclosure

Embodiments of the present invention relate to an organic light emitting display device using an encapsulation substrate.

2. Discussion of the Related Art

With the advancement of an information-oriented society, attention is being focused on technology for realizing a display device using an organic light emitting diode (OLED) which emits light in itself among various display devices. In contrast to a related art liquid crystal display device or plasma display device, the organic light emitting diode (OLED) has various advantages such as more rapid response speed, better light emitting efficiency and luminance, wider viewing angle and etc.

In a case of the display device using the organic light emitting diode (hereinafter, referred to as 'organic light emitting display device'), a plurality of pixels are arranged in a matrix configuration, wherein each pixel includes an organic light emitting diode, and a brightness in the pixels selected by a scan signal is controlled in accordance with a grayscale of data. Especially, since the organic light emitting display device emits light in itself, it is possible to realize high contrast ratio, ultra-thinness, dynamic image by a rapid response speed of several micro seconds (μs), and wide viewing angle. In addition, the organic light emitting display device is stably driven by a low voltage even at a low temperature so that it is possible to facilitate design and manufacturing process of a driving circuit. Also, a method for manufacturing the organic light emitting display device does not need a process for injecting liquid crystal of the related art liquid crystal display device. Furthermore, in case of the organic light emitting display device, a display panel is manufactured through a deposition of organic materials, and an encapsulation is used to protect the organic materials from moisture and oxygen.

FIG. 1A is a cross sectional view illustrating a related art organic light emitting display device. As shown in FIG. 1A, the related art organic light emitting display device includes an organic light emitting diode layer 30 formed between a first substrate 10 and a second substrate 20, whereby the related art organic light emitting display device displays an image by emitting light upwardly or downwardly.

FIG. 1B is a plane view illustrating the related art organic light emitting display device shown in FIG. 1A. As shown in FIG. 1B, a plurality of power lines are formed to apply power to each pixel (P), and the plurality of power lines are provided to apply various kinds (i.e., amounts) of power. Although not shown, the power line may extend to the inside of pixel so as to apply power needed to each pixel. For example, a high-potential voltage line (VL1) may extend on a first substrate 11 to the periphery of each pixel so as to apply a high-potential voltage, or a high-potential voltage line (VL3) may extend to the periphery of each pixel so as to apply a specific voltage. As shown in FIG. 1C, when a circuit formed in each pixel is designed to drive the organic light emitting diode layer only when the circuit is applied with various powers. The circuit includes a plurality of transistors including transistor T1, transistor T2, and transistor T3. The drain electrode of transistor T1 is connected to voltage supply VDD and the source of transistor T1 is connected to the anode of the organic light emitting diode (OLED) and the source of transistor T3. The gate of transistor T1 is connected to the drain of transistor T2. The source of transistor T2 is connected to Vdata. The drain of transistor T3 is connected to a reference voltage Vref. Furthermore, a capacitor (Cap) is connected between the gate and source of transistor T1.

Although not shown, after forming an organic light emitting material to apply a low-potential voltage on the first substrate 11, a cathode electrode layer may be formed to entirely cover an upper side of each pixel, or may be brought into contact with a side voltage line (VL2) at a side of the first substrate 11.

The high-potential voltage, low-potential voltage or specific voltage applied to the organic light emitting display device has to be maintained constantly without deviation, and transmitted to the plurality of pixels. However, according to a recent trend of a large-sized substrate, the voltage is not maintained constantly so that the deviation occurs in partial regions of the panel, that is, voltage drop (IR Drop) occurs.

The voltage drop might cause non-uniformity in the display characteristics of the panel of the organic light emitting display device. In severe cases, a product using the organic light emitting display device with the inferior display characteristics might be discarded.

SUMMARY

Accordingly, the embodiments of the present disclosure are directed to an organic light emitting display device that substantially obviates one or more problems due to limitations and disadvantages of the related art.

An aspect of the embodiments of the present disclosure is to provide an organic light emitting display device which is capable of preventing a voltage drop.

Another aspect of the embodiments of the present disclosure is to provide an organic light emitting display device which is capable of preventing a voltage drop by forming a plurality of metal layers on a second substrate of the organic light emitting display device which needs different kinds of power.

Another aspect of embodiments of the present disclosure is to provide an organic light emitting display device which is capable of preventing a voltage drop through an electrical contact between a metal layer formed on a second substrate and a power line formed on a first substrate.

A further aspect of embodiments of the present disclosure is to provide an organic light emitting display device which is capable of minimizing a size of a non-display area on a first substrate by forming signal transmission lines or power transfer lines on a second substrate instead of the first substrate.

Additional advantages and features of embodiments of the disclosure will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the disclosure, as embodied and broadly described herein, there is provided an organic light emitting display device that may include a first substrate; at least one pixel formed on the first substrate; a first power line formed on the first substrate, the first power line supplying a first voltage to the pixel; a second power line formed on the first substrate, the second power line supplying a second voltage to the pixel, the second voltage being different from the first voltage; and a second substrate formed over the first substrate, the second substrate including a first metal layer, a second metal layer, and an insulating layer formed between the first metal layer and the second metal layer, the insulating layer insulating the first metal layer and the second metal layer from each other, wherein the first metal layer is electrically connected with the first power line and the second metal layer is electrically connected to the second power line.

At this time, the first metal layer is electrically connected to the first power line through a first conductive medium and the second metal layer is electrically connected to the second power line through a second conductive medium.

Also, a size of the first conductive medium is different than a size of the second conductive.

Also, a distance between the second metal layer and the first substrate is greater than a distance between the first metal layer and the first substrate, and wherein a length of the second metal layer is longer than a length of the first metal layer along a first direction.

Also, a portion of at least one of the first metal layer or the second metal layer includes a metal protrusion that protrudes toward the first substrate, or a portion of at least one of the first power line or the second power line includes a protrusion that protrudes respectively toward either the first metal layer or the second metal layer.

Furthermore, the metal protrusion of either the first metal layer or the second metal layer and the protrusion of either the first power line or second power line is in direct contact, respectively, to electrically connect together either the first metal layer and the first power line or the second metal layer and the second power line.

Also, the metal protrusion of either the first metal layer or the second metal layer is respectively in direct contact with either the first power line or the second power line, respectively, to electrically connect together either the first metal layer and the first power line or the second metal layer and the second power line Also, the first metal layer includes at least one open area formed by removing a predetermined portion of the first metal layer, and the second metal layer is electrically connected with the second power line of the first substrate through the at least one open area.

The open area is not visible from a plane view of the organic light emitting display device.

Also, a length of the first metal layer is longer than a length of the second metal layer along a first direction.

Also, a contact area between the first metal layer and the first power line of the first substrate is formed in a direction of the length of the first metal layer.

Also, the organic light emitting display device further includes a sealing layer formed between the first substrate and the second substrate, the sealing layer covering the first conductive medium and the second conductive medium.

In one embodiment, an organic light emitting display device comprises a first substrate; at least one pixel formed on the first substrate; a power line formed on the first substrate, the power line supplying a voltage to the pixel; and a second substrate formed over the first substrate, the second substrate including a metal layer and a power transfer line formed on the second substrate, the power transfer line connected to the metal layer; wherein the metal layer included in the second substrate is connected to the power line included in the first substrate to electrically connect together the power transfer line and the power line.

It is to be understood that both the foregoing general description and the following detailed description of the present invention are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION

Reference will now be made in detail to the exemplary embodiments of the present invention, examples of which are illustrated in the accompanying drawings. Wherever possible, the same reference numbers will be used throughout the drawings to refer to the same or like parts. Hereinafter, on explanation about the embodiments of the present invention, if it is considered that the substance of the present invention is clouded by a detailed explanation for common knowledge or structures of the present invention, the detailed explanation will be omitted. Also, the terms used for illustrating elements of the present invention may be selected in consideration of easiness in writing a specification of the present invention, and the terms used thereinafter may be different from virtually-used terms of organic light emitting display device.

Hereinafter, an organic light emitting display device according to various embodiments will be described in detail with reference to the accompanying drawings.

Figure 1A:
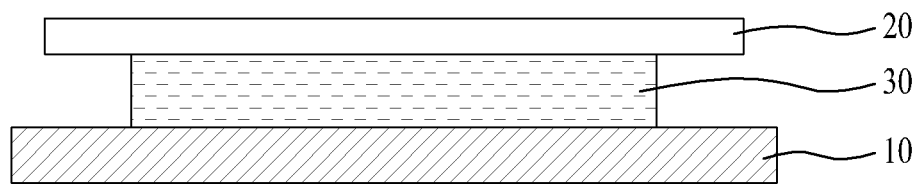
FIG. 1A is a cross sectional view illustrating a related art organic light emitting display device.
Figure 1B:
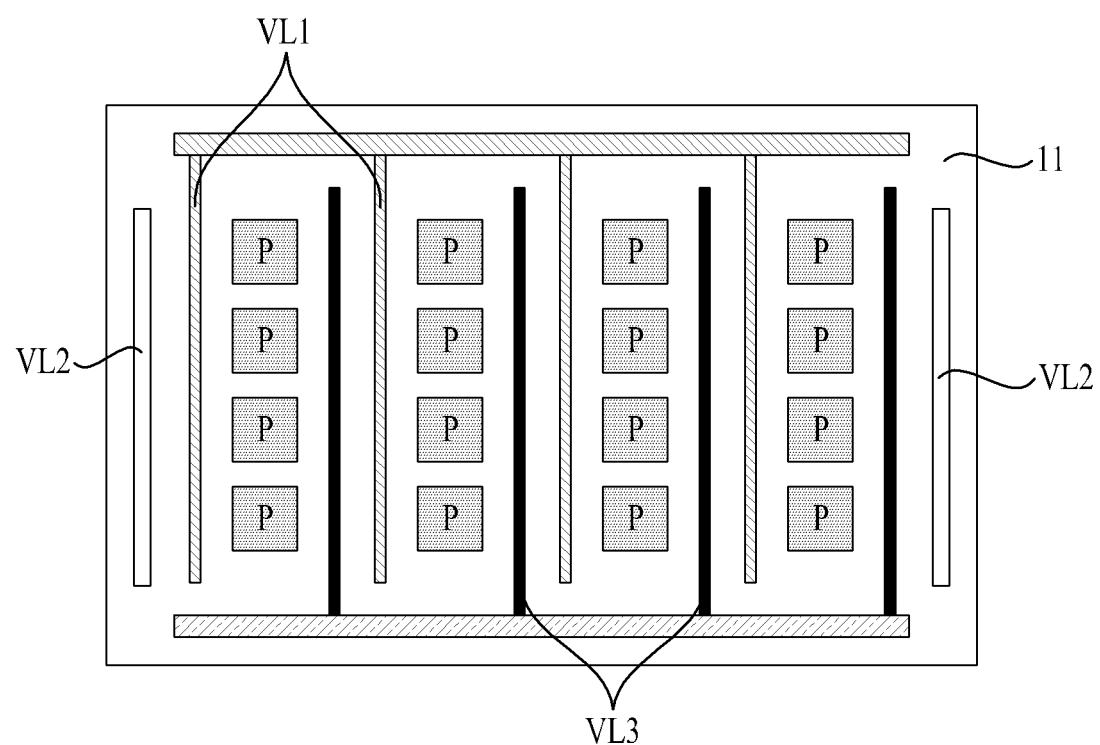
FIG. 1B is a plane view illustrating the related art organic light emitting display device.
Figure 1C:
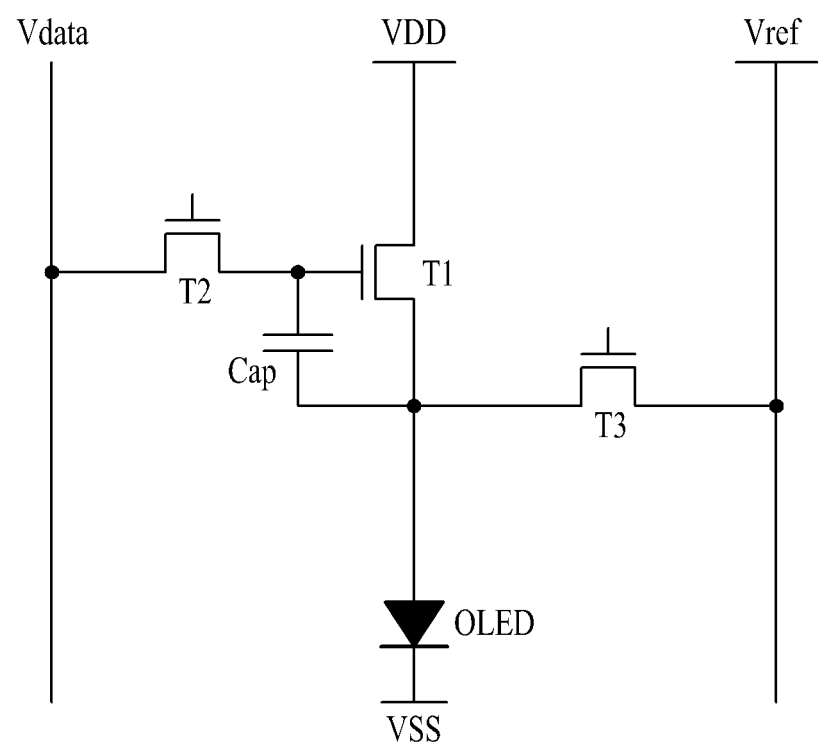
FIG. 1C is a circuit diagram of a pixel in the related art organic light emitting display device.
Figure 2A:
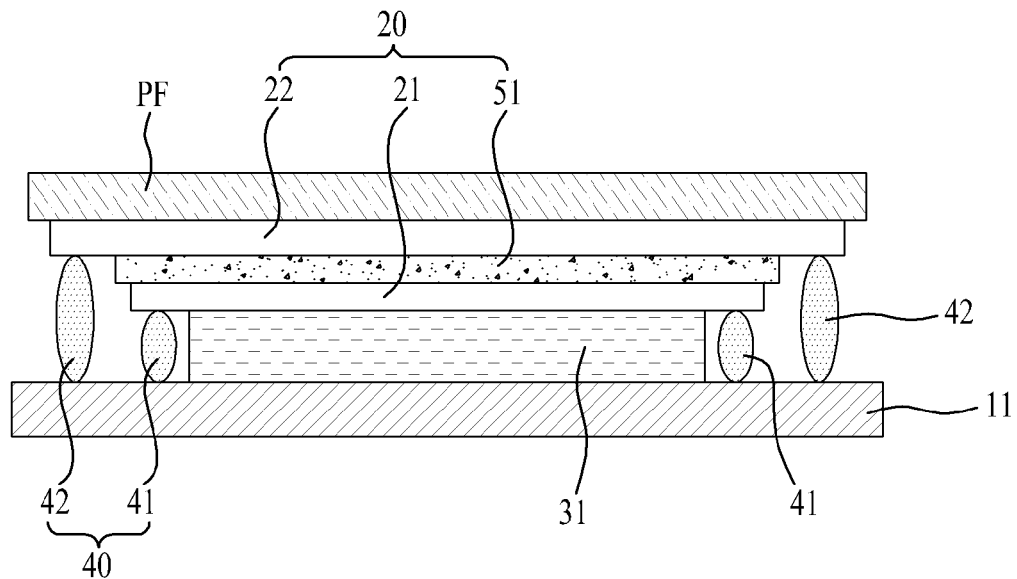
FIG. 2A illustrates an organic light emitting display device according to one embodiment.

Referring to FIG. 2A, an organic light emitting layer 31 is formed between first and second substrates 11 and 20. In this case, the second substrate 20 includes first and second metal layers 21 and 22, and a first insulating layer 51 is formed between the first and second metal layers 21 and 22. Although not shown in FIG. 2A, a plurality of power lines (not shown) are formed on the first substrate 11. Also, a protection film (PF) may be additionally formed on the second substrate 20, to thereby protect the second substrate 20.

At least one conductive medium 40 may be formed between the first and second substrates 11 and 20. In this case, a first conductive medium 41 may be provided to bring the first metal layer 21 into electrical contact with the predetermined power line (not shown) formed on the first substrate 11. Also, a second conductive medium 42 may be provided to bring the second metal layer 22 into electrical contact with another power line (not shown) formed on the first substrate 11.

The second substrate 20 may confront with the first substrate 11. That is, the second substrate 20 is formed over the first substrate 11 so as to face the first substrate 11. The first and second substrates 11 and 20 may be bonded to each other by the use of adhesive or film with adhesive strength. The film with adhesive strength may be formed by a front sealing (FS), which will be described later with reference to FIG. 4.

Referring to FIG. 2A, a circuit (not shown) is provided to drive the organic light emitting layer 31 formed on the first substrate 11. The circuit may include a driving transistor (not shown) for driving the organic light emitting layer 31, and a switching transistor (not shown) for controlling the driving transistor. In addition, a transistor (not shown) and a capacitor (not shown) may be additionally provided to perform an appropriate signal transmission and a compensation of the driving transistor. At least one pixel may be included in the first substrate 11.

In order to control the pixel, the first substrate 11 may include a data signal line (not shown) for applying a data signal, a scan signal line (not shown) for applying a scan signal, and power lines (not shown) for applying a specific power to each pixel.

In this case, since the plurality of transistors and capacitors are included in each pixel formed on the substrate 11, it necessarily requires a plurality of power sources with different kinds of voltages. Generally, a high-potential voltage, a low-potential voltage and a reference voltage (Vref) may be applied. In order to supply the different kinds of voltages, the different kinds of power lines may be formed on the first substrate 11.

As mentioned above, the organic light emitting layer 31 shown in FIG. 2A may be formed between the first and second substrates 11 and 20, or may be formed between first and second electrodes (not shown). Also, a protection layer (not shown) may be formed on the organic light emitting layer 31, wherein the protection layer protects organic materials from moisture or oxygen.

The organic light emitting layer 31 may include a hole injection layer, a hole transport layer, a light emitting layer, an electron transport layer, and an electron injection layer. Furthermore, the organic light emitting layer 31 may include a functional layer for improving light-emitting efficiency and/or lifespan of the organic light emitting layer 31. Also, the organic light emitting layer 31 may be formed in a single-layered structure of a light-emitting material layer for emitting a specific colored light, or a multi-layered structure including a plurality of light-emitting layers. Generally, the organic light emitting layer 31 with the multi-layered structure emits white light. If providing an additional color filter to the organic light emitting layer 31 with the multi-layered structure, it is possible to realize a specific color corresponding to the color filter.

The above conductive medium 40 may be formed in various shapes. Generally, the conductive medium 40 may be formed of an anisotropic conducting film (ACF) used to electrically connect two terminals to each other. The anisotropic conducting film (ACF) may be a film with conductivity, which may be manufactured by forming conductive balls, that is, metal particles such as nickel (Ni) or aurum (Au) and conducting electricity on a specific axis therein. The conductive balls included in the anisotropic conducting film (ACF) may vary in size so that the conductive balls may function as the medium between the two terminals to be electrically conductive.

Also, the anisotropic conducting film (ACF) may be formed in a paste type rather than a film type. In this case, it may be referred to as anisotropic conductive paste (ACP). If providing the anisotropic conducting paste (ACP), the conductive medium 40 may be manufactured by spreading the paste on a substrate, to thereby facilitate a manufacturing process.

Also, the conductive medium 40 may be formed by soldering. The various methods for forming the conductive medium 40 are disclosed as above, but not limited to the aforementioned methods. Any method capable of being applied to the organic light emitting display device may be possible.

The protection film (PF) may be additionally provided on the above second substrate 20, to protect the second substrate 20 and the organic light emitting display device. The protection film (PF) may be formed in a film type, but not limited to the film type. In this case, the protection film (PF) electrically insulates the second substrate 20 including the plurality of metal layers from external static electricity, and also protects the organic light emitting display device from external shock. However, the protection film (PF) is not a necessity in the organic light emitting display device according to one embodiment. That is, the protection film (PF) may be selectively provided or not.

FIG. 2A illustrates the second substrate 20 of the organic light emitting display device according to one embodiment.

As mentioned above, the second substrate 20 may include the first and second metal layers 21 and 22, and the first insulating layer 51 formed between the first and second metal layers 21 and 22. In this case, the first insulating layer 51 may be electrically or thermally insulated from the first and second metal layer 21 and 22. Also, each of the first and second metal layers 21 and 22 may be electrically brought into contact with the predetermined power lines formed on the first substrate 11 through the conductive medium 40. The embodiments of the conductive medium will be described as follows.

In order to bring the first and second metal layers 21 and 22 into electrical contact with the predetermined power lines formed on the first substrate 11, the first metal layer 21 may be electrically brought into contact with one power line (not shown) formed on the first substrate 11 through the first conductive medium 41, and the second metal layer 22 may be electrically brought into contact with another power line (not shown) formed on the first substrate 11 through the second conductive medium 42.

As mentioned above, the second substrate 20 includes at least two metal layers so that it is possible to obtain the different electrical contacts between the respective metal layers and the power lines being applied with the different powers.

The pixel of the organic light emitting display device according to one embodiment needs various voltages. Applying the high-potential voltage may be performed on a panel. If the panel has a large size, there is a high possibility that a voltage applied to a lower area of the panel is lower than a voltage applied to an upper area of the panel due to an interval between the lower and upper areas of the panel. This is because a long distance causes a large resistance. That is, if the voltage (or current) has a long path, the voltage is not maintained constantly, that is, the voltage is dropped midway. In order to remove the increase of resistance which causes the voltage drop, the metal layers 21 and 22 formed on the second substrate 20 are electrically connected with the power lines formed on the first substrate 11 so that the resistance is reduced by volume of the metal layers 21 and 22 formed on the second substrate 20, thereby preventing the aforementioned voltage drop.

In the organic light emitting display device according to one embodiment, signal transmission lines (not shown) or power transfer lines (not shown), which are needed to the first substrate 11, are formed on the second substrate 20 so that it is possible to minimize a size of non-display area on the first substrate 11.

That is, generally, since LOG (Line On Glass) lines or power transfer lines are formed on the non-display area of the first substrate 11, it is necessary to obtain an area for the LOG lines or power transfer lines in the non-display area. That is, the size of non-display area is increased to obtain the above area so that it is difficult to realize a narrow bezel by minimizing the non-display area.

In the organic light emitting display device according to one embodiment, the LOG line or power transfer line may be used through the first metal layer 21 and/or second metal layer 22 formed on the second substrate 20. That is, instead of forming the LOG line or power transfer line on the first substrate 11, the LOG line or power transfer line may be formed on the second substrate 20, and then the LOG line or power transfer line formed on the second substrate 20 may be electrically connected with the lines needed for the first substrate 11 through the use of first metal layer 21 and/or second metal layer 22.

According to one embodiment, the size of first metal layer 21 formed on the second substrate 20 is different from the size of second metal layer 22 formed on the second substrate 20. It is necessary to insulate the first and second metal layers 21 and 22 from each other so that the electrical contact between the first metal layer 21 of the second substrate 20 and the predetermined power lines of the first substrate 11 becomes different from the electrical contact between the second metal layer 22 of the second substrate 20 and the other power lines of the first substrate 11.

As shown in FIG. 2A, the first and second metal layers 21 and 22 are electrically brought into contact with the power lines of the first substrate 11 in the periphery corresponding to the non-display area of the panel through the different conductive media. Thus, the first metal layer 21 may be different in size from the second metal layer 22, and the first and second metal layers 21 and 22 may be respectively brought into contact with the different power lines formed on the first substrate 11.

However, it is not limited to the first and second metal layers 21 and 22 which have the different sizes. According to another embodiment to be described, the first and second metal layers may have the same size.

Figure 2B:
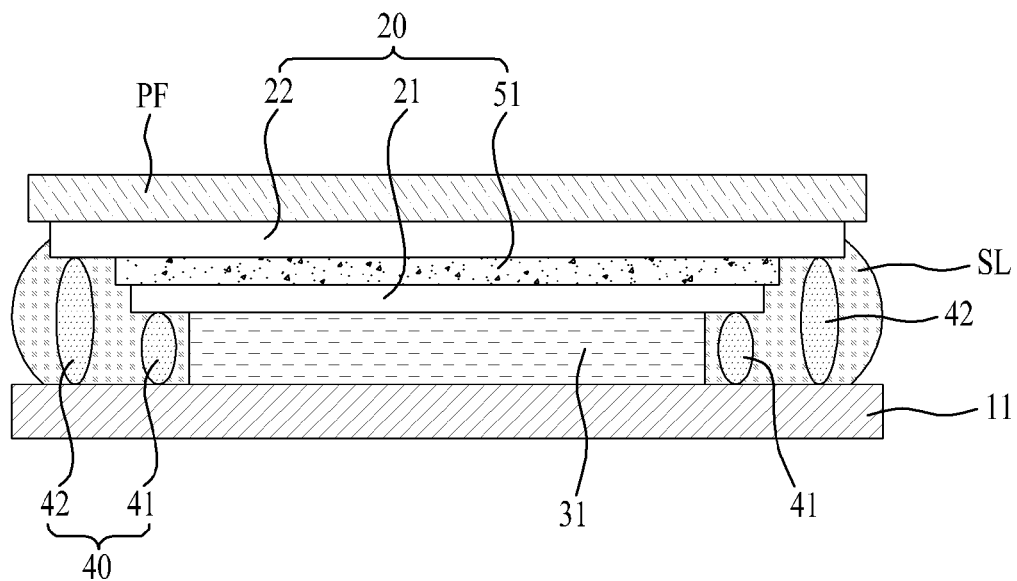
FIG. 2B illustrates an organic light emitting display device with a side sealing according to another embodiment.

FIG. 2B illustrates a second substrate 20 of an organic light emitting display device according to another embodiment, wherein a repetitive explanation described with reference to FIG. 2A will be omitted. Generally, the organic light emitting display device is vulnerable to moisture and oxygen so that an encapsulation substrate for sealing the organic light emitting display device is inevitably needed. As shown in FIG. 2B, a side sealing (SL) (e.g., a sealing layer) may be additionally provided to prevent a permeation of moisture and oxygen through side surfaces. In this case, the side sealing (SL) is formed to perfectly seal a space between first and second substrates 11 and 20, to thereby improve efficiency in preventing the permeation of moisture and oxygen.

Figure 2C:
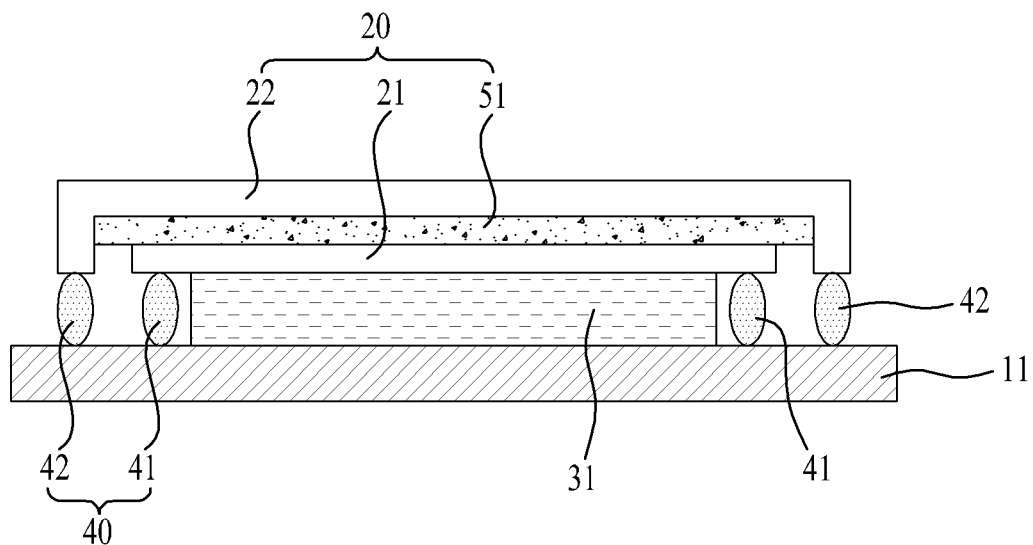
FIG. 2C is a cross sectional view of an organic light emitting display device according to another embodiment.

FIG. 2C illustrates an organic light emitting display device according to another embodiment, wherein a conductive medium 40 includes first conductive medium 41 and second conductive medium 42 which have the same size. As shown in FIG. 2C, if each side of a second metal layer 22 has a metal protrusion which protrudes toward a first substrate 11, it is possible to provide the first conductive medium 41 and the second conductive medium 42 which have the same size. In this case, a conductive ball included in the first conductive medium 41 may be identical in size to a conductive ball included in the second conductive medium 42.

Also, the aforementioned metal protrusion may be formed by bending the second metal layer 22, or by differently etching the second metal layer 22, that is, etching more a peripheral region of the second metal layer 22 in comparison to a central region of the second metal layer 22. The method for forming the metal protrusion is not limited to the above bending and etching methods. The method for forming the metal protrusion may vary depending on material characteristics of the second metal layer 22.

Figure 2D:
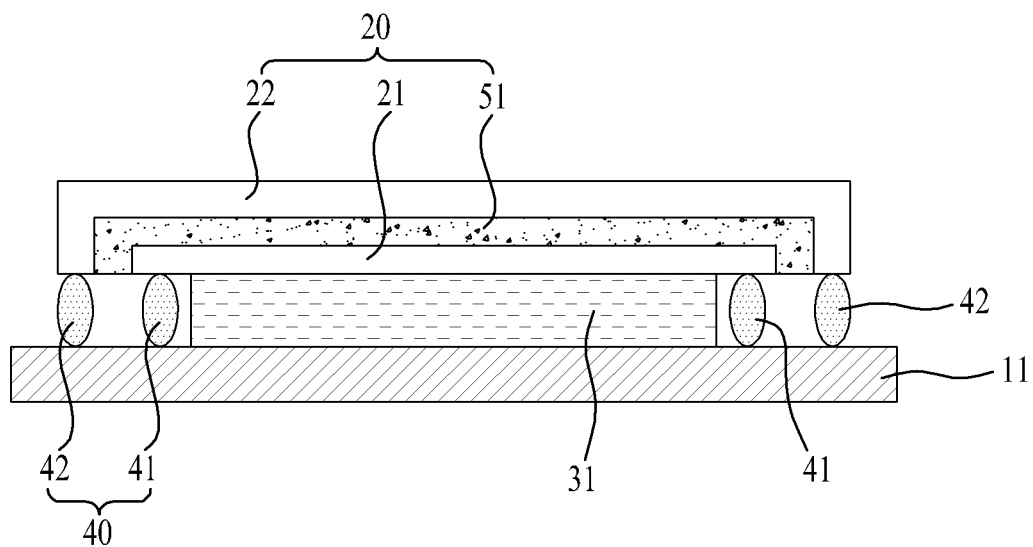
FIG. 2D is a cross sectional view of an organic light emitting display device according to another embodiment.

FIG. 2D illustrates an organic light emitting display device according to another embodiment, which is very similar to the organic light emitting display device described with reference to FIG. 2C except that a first insulating layer 51 covers a first metal layer 21. That is, the first metal layer 21 is completely insulated from a second metal layer 22. Thus, as shown in FIG. 2D, the first insulating layer 51 prevents the contact between the first and second metal layers 21 and 22 at maximum, whereby the first metal layer 21 and the second metal layer 22 are insulated from each other.

Figure 3A:
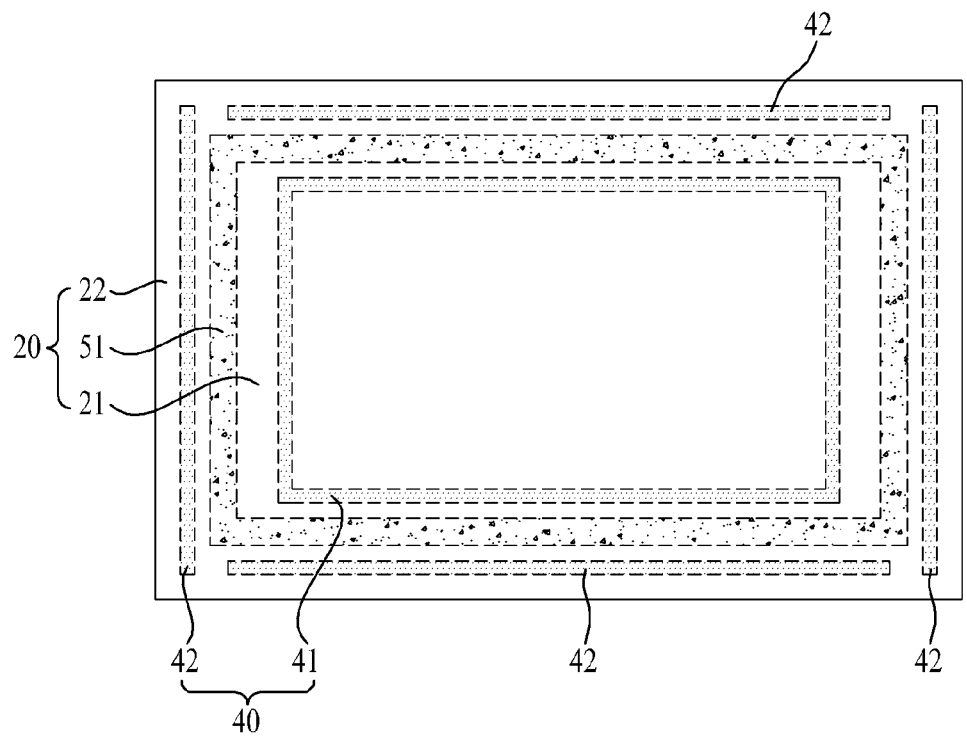
FIGS. 3A to 3C illustrate various positions of conductive medium of the organic light emitting display device according to one embodiment.

FIG. 3A is a plane view showing the position of the first conductive medium 41 and the second conductive medium 42 in the organic light emitting display device according to one embodiment. The first conductive medium 41 and the second conductive medium 42 are positioned in the non-display area so as to avoid an interference for a display area.

Also, the first metal layer 21 and the second metal layers 22 are electrically insulated from each other. Similarly, the first conductive medium 41 and the second conductive medium 42 are electrically insulated from each other. In this case, the first insulating layer 51 interposed between the first and second metal layers 21 and 22 is larger than the first metal layer 21, wherein the first insulating layer 51 insulates the first and second metal layers 21 and 22 from each other. In order to electrically connect each of the first and second metal layers 21 and 22 with the corresponding power lines (not shown) formed on the first substrate 11, as shown in FIG. 3A, the electrical contact area may be formed at four sides of the panel.

Figure 3B:
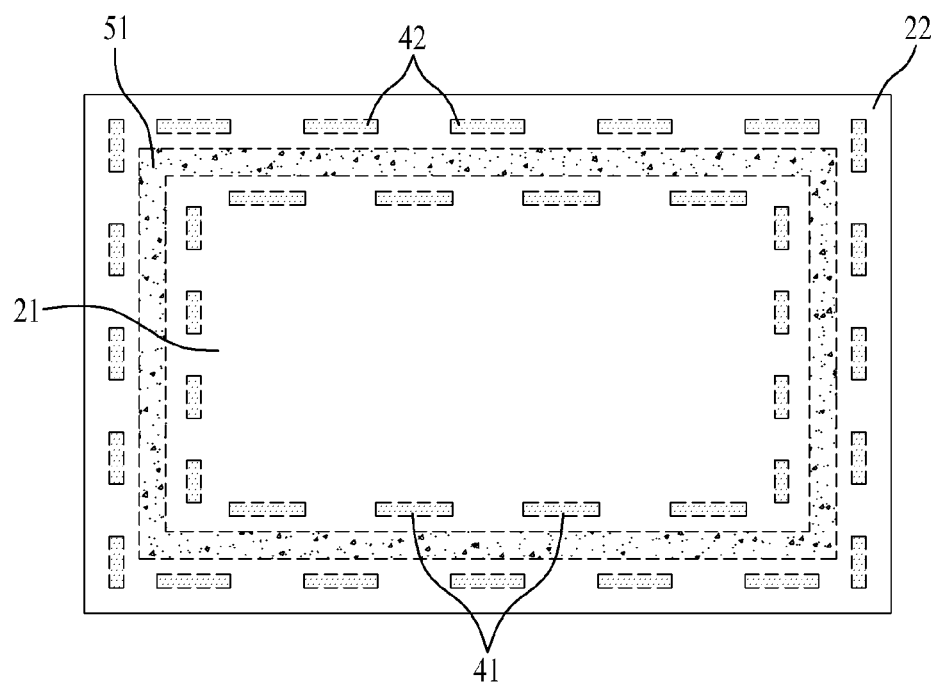

In like manner to that of FIG. 3A, FIG. 3B is a plane view showing another example of the position of the first conductive medium 41 and the second conductive medium 42 in the organic light emitting display device according to one embodiment. In this case, each of the first conductive medium 41 and the second conductive medium 42 may be formed of a plurality of patterns, wherein the size of contact area may be adjusted appropriately. Generally, in case of providing the small contact area, there is a high possibility that a resistance is more decreased in comparison to that of the large contact area. If providing the large contact area, a resistance is increased due to contact failures. Accordingly, it is possible to maintain an optical contact state by adjusting the size of contact area.

Figure 3C:
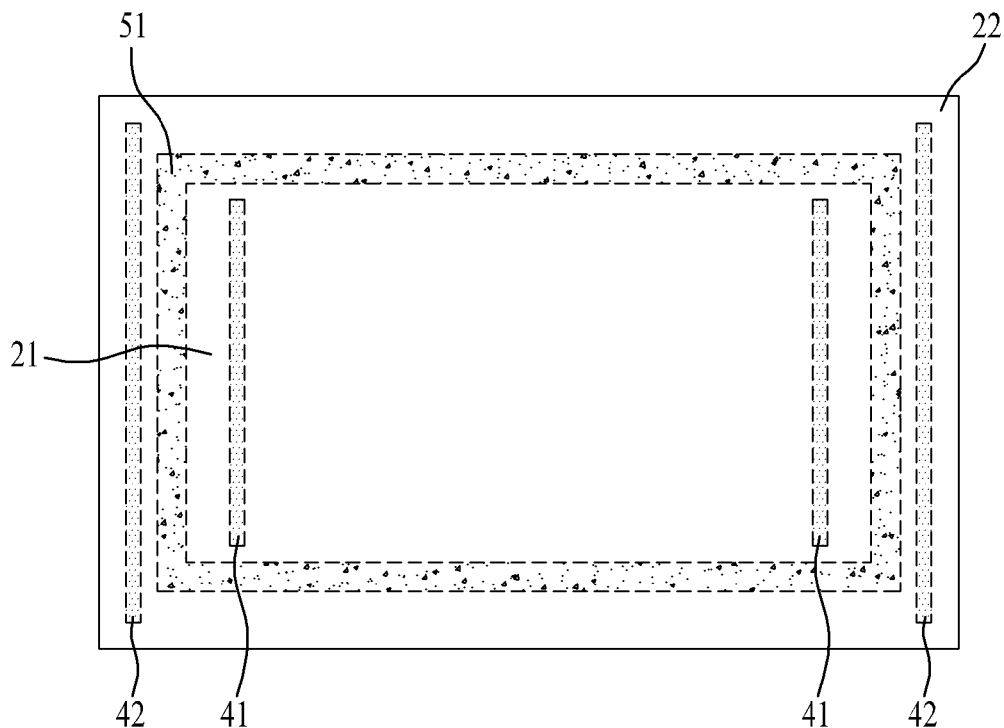

In like manner to that of FIG. 3B, FIG. 3C is a plane view showing another example of the position of the first conductive medium 41 and the second conductive medium 42 in the organic light emitting display device according to one embodiment.

Figure 4:
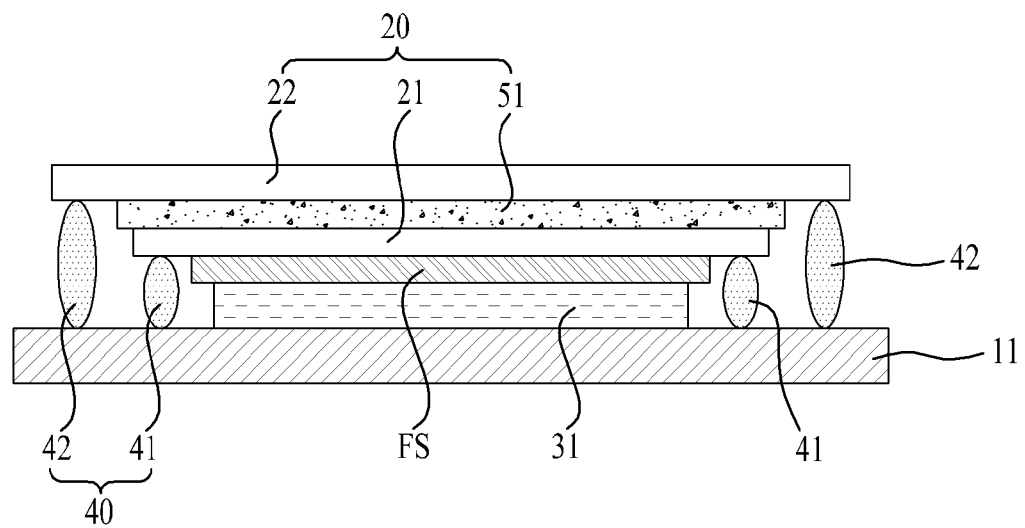
FIG. 4 illustrates a front sealing in the organic light emitting display device according to one embodiment.

FIG. 4 illustrates a front sealing (FS) interposed between the first and second substrates 11 and 20 in the organic light emitting display device according to one embodiment. Generally, an adhesive or a film with adhesive strength is provided to bond the first and second substrates 11 and 20 to each other in the organic light emitting display device. In FIG. 4, the front sealing (FS) is additionally provided to bond the first and second substrates 11 and 20 to each other. In this case, the front sealing (FS) may be smaller than the first metal layer 21, or may be identical in size to the first metal layer 21. If needed, the front sealing (FS) may be larger than the first metal layer 21. If the front sealing (FS) is identical in size to the first metal layer 21, the metal protrusion of the first metal layer 21 penetrating through the front sealing (FS) may be electrically connected with the corresponding power line (not shown) formed on the first substrate 11.

Figure 5A:
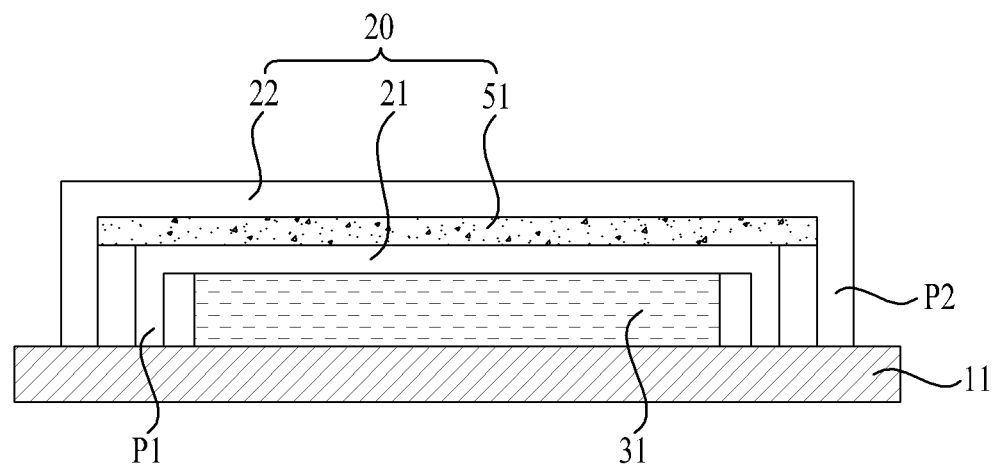
FIG. 5A is a cross sectional view illustrating an organic light emitting display device according to another embodiment.

FIG. 5A is a cross sectional view illustrating an organic light emitting display device according to another embodiment, which shows the electrical contact between each of first and second metal layers 21 and 22 formed on a second substrate 20 and corresponding power lines (not shown) formed on a first substrate 11 without using the aforementioned conductive medium 40.

That is, the first metal layer 21 is provided with a first protrusion (P1) protruding toward the first substrate 11, whereby the first protrusion (P1) of the first metal layer 21 is brought into contact with the corresponding power line (not shown) formed on the first substrate 11. The second metal layer 22 is provided with a second protrusion (P2) protruding toward the first substrate 11, whereby the second protrusion (P2) of the second metal layer 22 is brought into contact with another corresponding power line (not shown) formed on the first substrate 11.

Figure 5B:
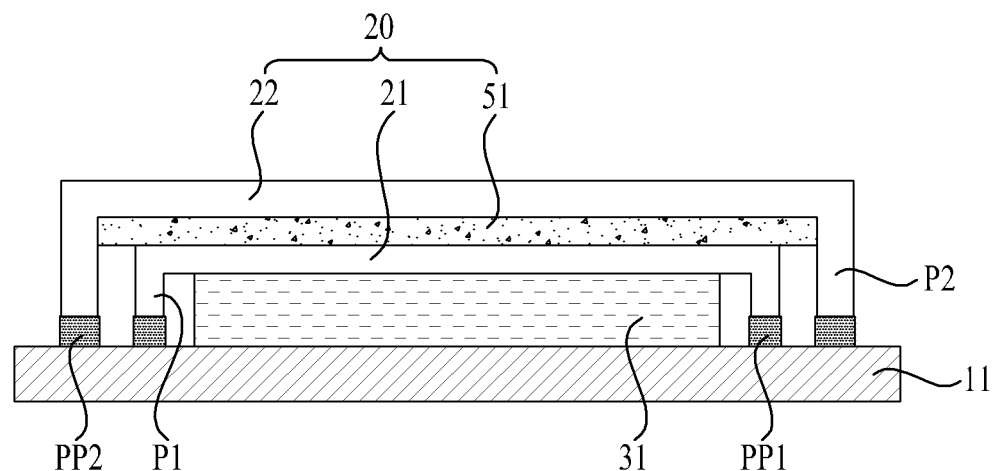
FIG. 5B is a cross sectional view illustrating an organic light emitting display device according to another embodiment.

In like manner to that of FIG. 5A, FIG. 5B is a cross sectional view illustrating an organic light emitting display device according to another embodiment, which shows the electrical contact between each of first and second metal layers 21 and 22 formed on a second substrate 20 and corresponding power lines (not shown) formed on a first substrate 11 without using the aforementioned conductive medium 40. In addition to FIG. 5A, FIG. 5B illustrates additionally-provided first and second line protrusions (PP1, PP2) of power lines (not shown) formed on the first substrate 11, which enable to bring the power lines (not shown) formed on the first substrate 11 into contact with the respective first and second metal layers 21 and 22 without using the conductive medium. Although not shown, it is possible to provide the first metal layer 21 without the first protrusion (P1) or the second metal layer 22 without the second protrusion (P2).

Figure 6A:
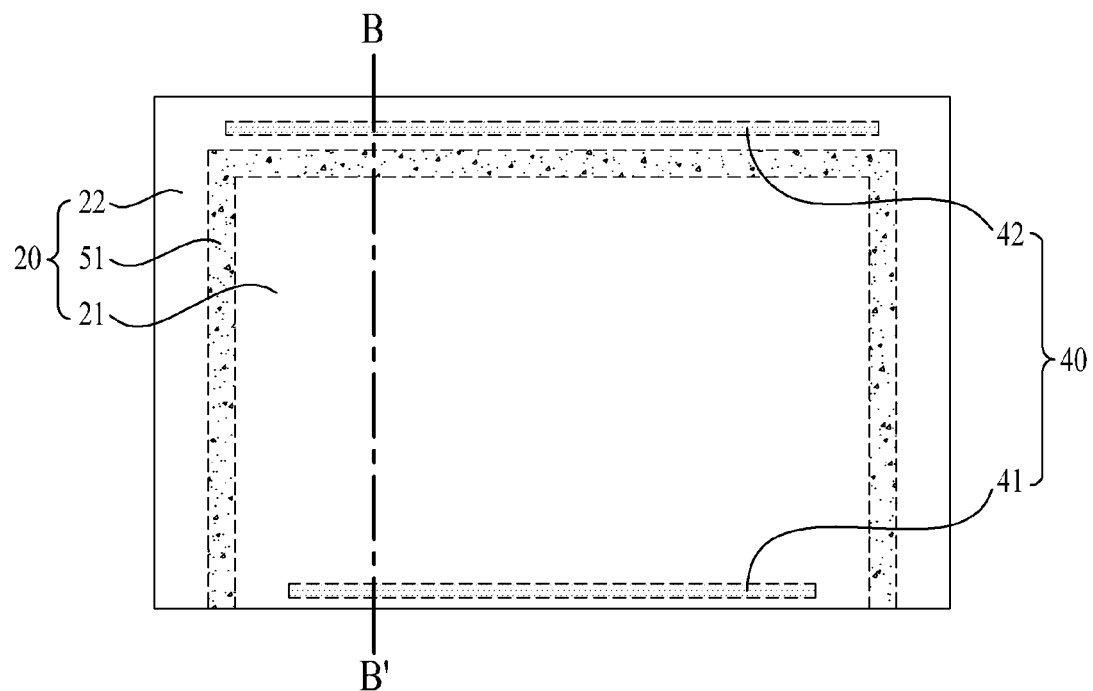
FIG. 6A is a plane view illustrating an organic light emitting display device according to another embodiment.

FIG. 6A is a plane view illustrating an organic light emitting display device according to another embodiment. In FIG. 6A, first and second metal layers 21 and 22 are provided while being aligned at one side. In this case, the contact area between the first metal layer 21 and corresponding power line (not shown) of a first substrate 11 is separated from the contact area between the second metal layer 22 and another corresponding power line (not shown) of the first substrate 11, so that it is possible to lower a possibility of electrical interference. According as the first and second metal layers 21 and 22 are aligned at one side, a manufacturing process is simplified by the alignment.

Figure 6B:
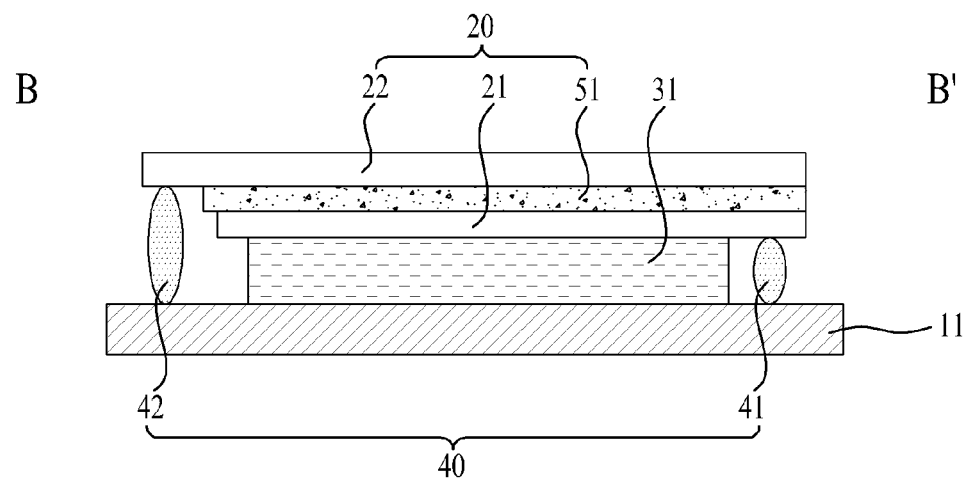
FIG. 6B is a cross sectional view along B-B' of FIG. 6A according to one embodiment.

FIG. 6B is a cross sectional view along B-B of FIG. 6A, wherein a repetitive explanation for the parts described with reference to FIG. 6A will be omitted. As shown in FIG. 6B, the first and second metal layers 21 and 22 are aligned at the right side.

Figure 7A:
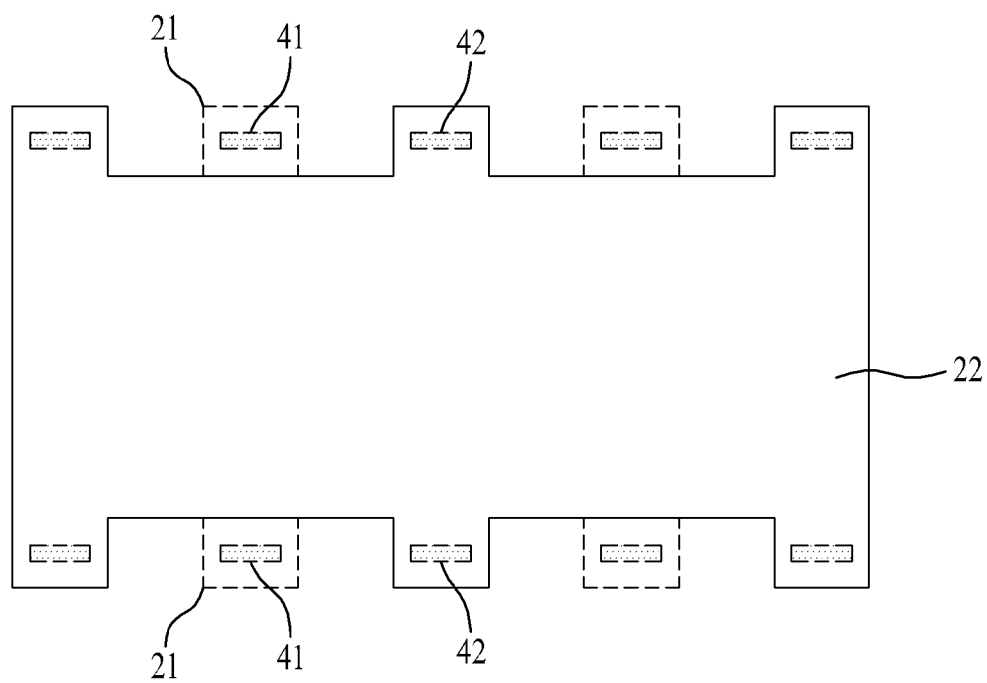
FIG. 7A is a plane view illustrating an organic light emitting display device according to another embodiment.

FIG. 7A is a plane view illustrating an organic light emitting display device according to another embodiment. In FIG. 7A, first and second metal layers 21 and 22 formed on a second substrate 20 are formed in the same area or size. For the aforementioned embodiments, the first and second metal layers 21 and 22 having the different sizes are brought into contact with the power lines of the first substrate 11. However, in case of the organic light emitting display device shown in FIG. 7A, the first metal layer 21 is identical in size to the second metal layer 22.

In the organic light emitting display device of FIG. 7A, predetermined portions of upper or lower side of the first metal layer 21 and/or the second metal layer 22 included in the second substrate 20 are removed by patterning, whereby open areas (not shown) are formed to make the electric contact area of the metal layers, to thereby realize the embodiment of the organic light emitting display device provided with the metal layers having the same size. In this case, the open areas may be formed by cutting, etching or various methods.

Figure 7B:
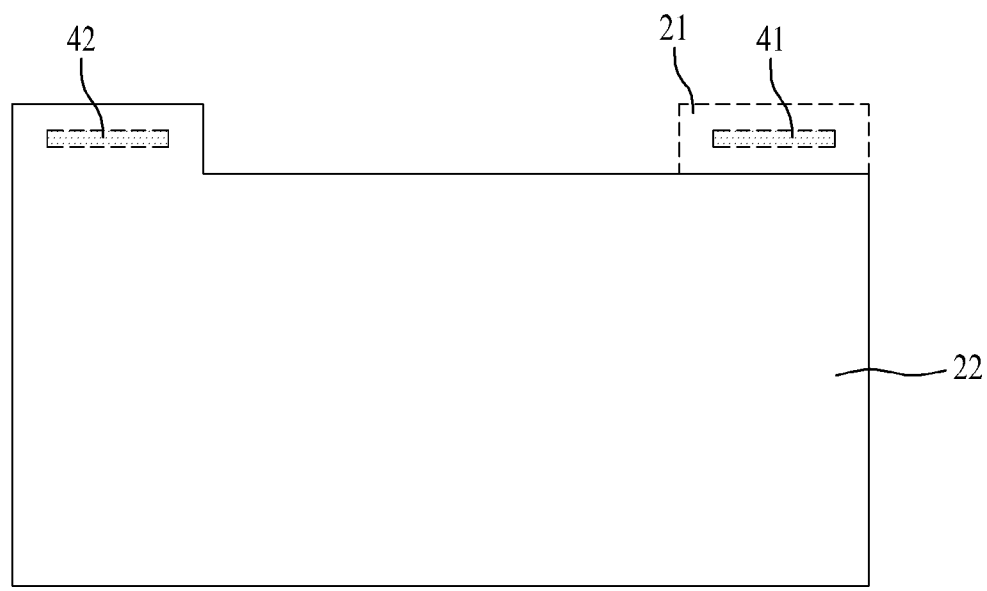
FIG. 7B is a plane view illustrating an organic light emitting display device according to another embodiment.

In like manner to that of FIG. 7A, FIG. 7B is a plane view illustrating an organic light emitting display device according to another embodiment, wherein opening areas are formed by partially patterning upper areas of first and second metal layers 21 and 22.

Figure 8A:
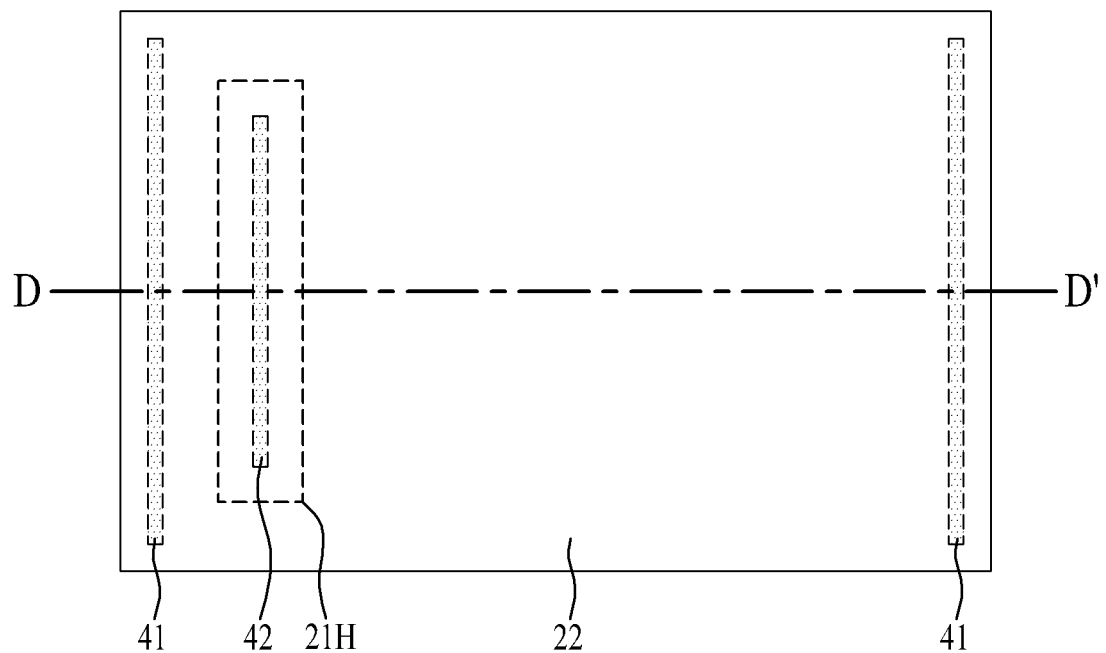
FIG. 8A is a plane view illustrating an organic light emitting display device according to another embodiment.

FIG. 8A is a plane view illustrating an organic light emitting display device according to another embodiment, which is very similar to the organic light emitting display device described with reference to FIG. 7A or 7B except that an open area hole 21H is formed by patterning a predetermined portion of a first metal layer 21. From a plane view, the open area hole 21H may be formed in a closed type. That is, the open area hole 21H is not visible from the plane view.

A second metal layer 22 may be brought into contact with a power line formed on a first substrate 11 through the open area hole 21H. In this case, an open area may be formed in a first insulating layer 51, wherein the open area of the first insulating layer 51 may be provided at the same or similar position to that of the open area hole 21H of the first metal layer 21.

Figure 8B:
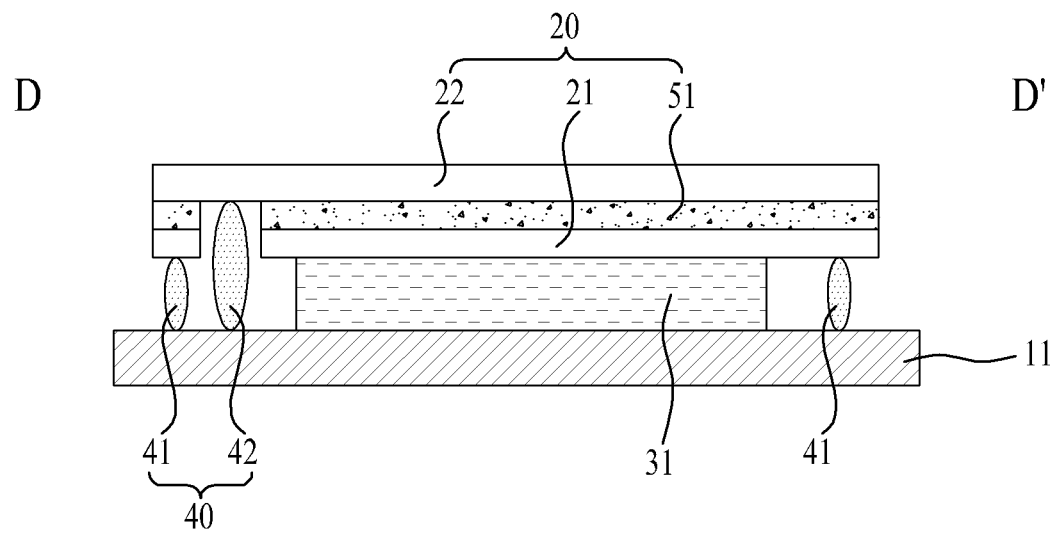
FIG. 8B is a cross sectional view along D-D' of FIG. 8A according to one embodiment.

FIG. 8B is a cross sectional view along D-D' of FIG. 8A, which roughly shows the characteristics of FIG. 8A. A repetitive explanation for the parts described with reference to FIG. 8A will be omitted.

Figure 9A:
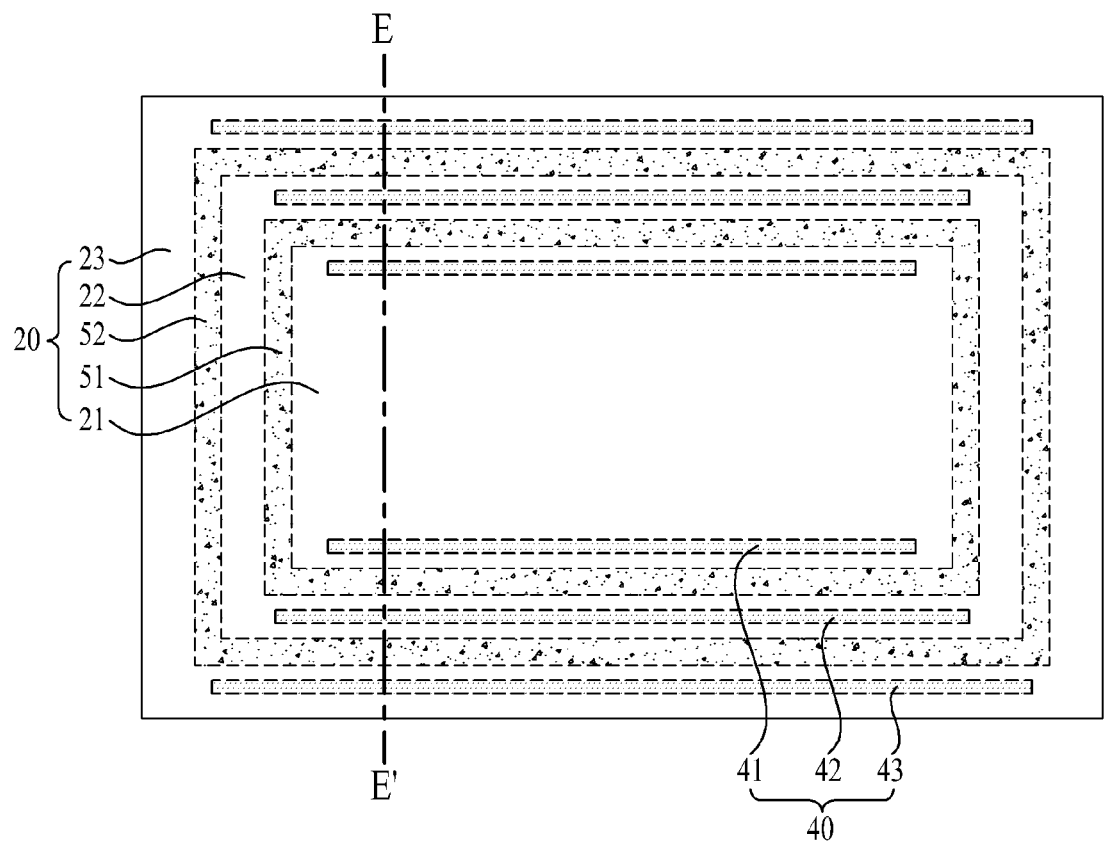
FIG. 9A is a plane view illustrating an organic light emitting display device according to another embodiment.

FIG. 9A is a plane view illustrating an organic light emitting display device according to another embodiment. In the organic light emitting display device of FIG. 9A, a third metal layer 23 and a second insulating layer 52 are additionally formed on a second substrate 20. That is, in case of the organic light emitting display device shown in FIG. 9A, the three different metal layers are formed on the second substrate 20, and are respectively connected with three different power lines of a first substrate 11. Thus, if three kinds of power are needed to a pixel of the first substrate 11, it is possible to apply the organic light emitting display device of FIG. 9A. In this case, a conductive medium 40 may include a first conductive medium 41, a second conductive medium 42 and a third conductive medium 43 which have different sizes.

Figure 9B:
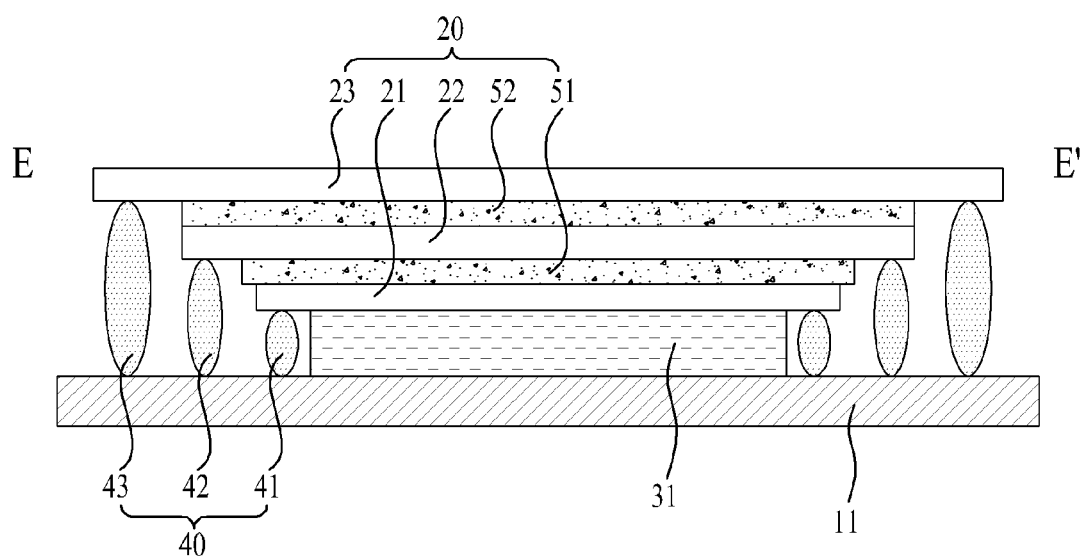
FIG. 9B is a cross sectional view along E-E' of FIG. 9A according to one embodiment.

FIG. 9B is a cross sectional view along E-E' of FIG. 9A, which roughly shows the characteristics of FIG. 9A. A repetitive explanation for the parts described with reference to FIG. 9A will be omitted.

Figure 10:
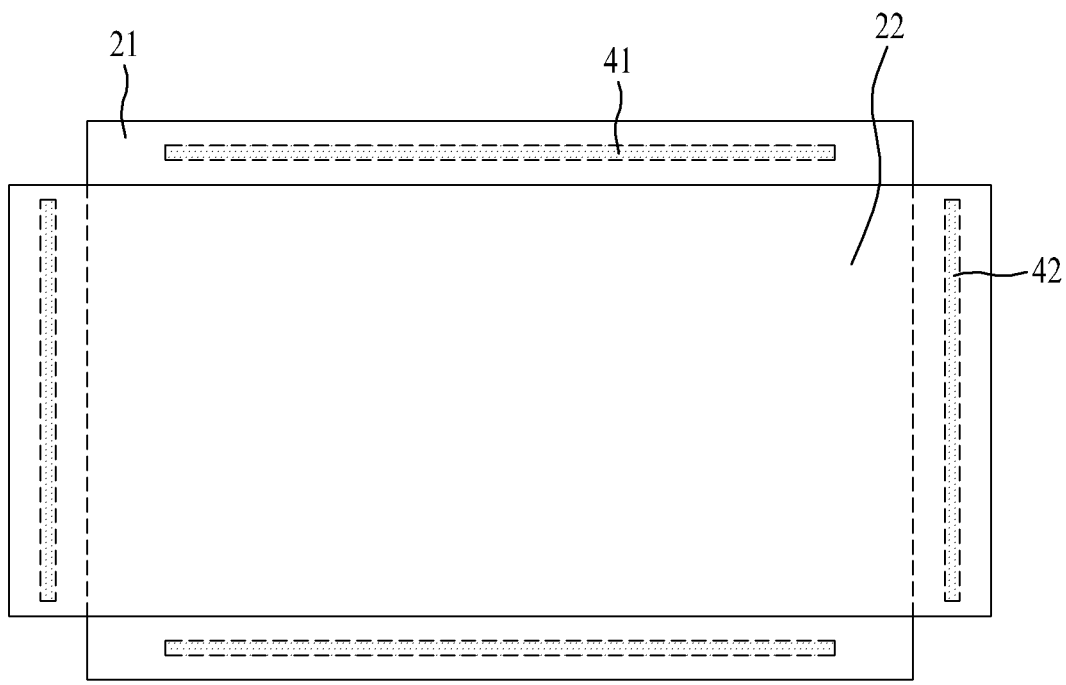
FIG. 10 illustrates a second substrate in the organic light emitting display device according to one embodiment.

FIG. 10 is a plane view illustrating an organic light emitting display device according to another embodiment. Referring to FIG. 10, a length of a first direction of a first metal layer 21 may be longer than a length of a first direction of a second metal layer 22. In this case, a contact area between the first metal layer 21 and a predetermined power line of a first substrate 11 may be provided in a lower or upper side. In order to electrically connect the second metal layer 22 and another power line of the first substrate 11, a contact area between the second metal layer 22 and another power line of the first substrate 11 may be differently positioned from the contact area between the first metal layer 21 and the predetermined power line of the first substrate 11. If requiring pressure and heat so as to an electric contact of a conductive medium 40, only corresponding metal layer can be directly heated or pressed without any influence on the other metal layers included in the second substrate 20, to thereby minimize an interference for the other metal layers.

Figure 11:
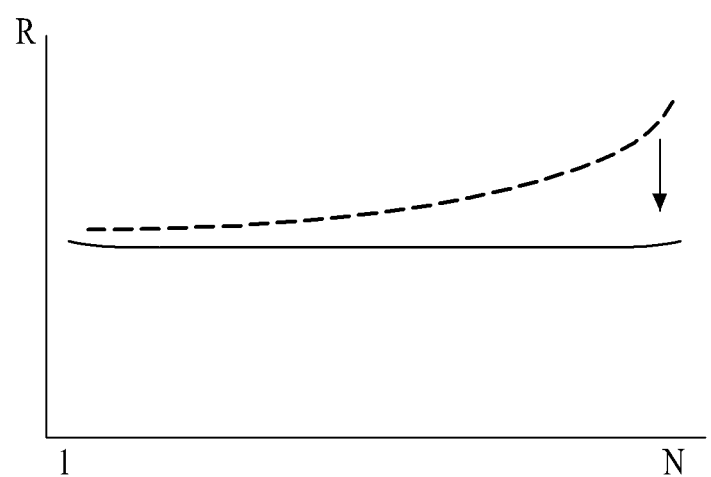
FIG. 11 is a graph showing an effect on reduction of resistance in the organic light emitting display device.

FIG. 11 is a graph showing an effect on reduction of resistance in the organic light emitting display device according to the present invention. Referring to the graph of FIG. 11, the X-axis shows a distance between a voltage applying position and a portion of the panel, wherein '1' indicates a portion of panel to which the voltage is applied, and 'N' is a portion of panel which is distant from the voltage applying position, and the Y-axis shows an amount of voltage drop (R) in the panel.

In this case, a dotted line shows an amount of voltage drop (R) according to the position of the panel in the related art, and a solid line shows an amount of voltage drop (R) according to the position of the panel in the present invention.

Accordingly, in case of the organic light emitting display device according to the embodiments herein, the voltage drop (R) is equally lowered on the entire area of the panel, so that it is possible to remove non-uniformity on the panel.

According to the present invention, the second substrate 20 provided with the metal layers may be used as the encapsulation substrate, and furthermore may be used as an auxiliary electrode for reducing the resistance of power line formed on the first substrate 11.

Also, the plurality of metal layers are formed on the second substrate 20 in the organic light emitting display device according to the present invention, to thereby prevent the voltage drop of the different power lines formed on the first substrate 11.

Also, the second substrate 20 of the organic light emitting display device according to the embodiment of the present invention is provided with the plurality of metal layers, whereby the transmission lines (not shown) or power transfer lines (not shown), which needs the different kinds of power, are formed on the second substrate 20. Accordingly, the line structure of the first substrate 11 is simplified so that it is possible to minimize the size of non-display area on the first substrate 11.

Also, in case of the organic light emitting display device according to the embodiment of the present invention, the transmission lines (not shown) or power transfer lines (not shown) are formed on the second substrate 20 instead of the first substrate 11, to thereby simplify the line structure of the first substrate 11.

For the above explanation described with reference to the drawings, the shape, size, ratio, angle and number may be variable. Also, since the drawings are shown in view of observer, the direction or position of the drawings may be variable in various ways. Wherever possible, the same reference numbers will be used throughout the drawings to refer to the same or like parts. On explanation about the embodiments of the present invention, it should be understood that the term such as "include", "comprise" or "have" does not preclude existence or possibility of one or more features, numbers, steps, operations, elements, parts or their combinations. Also, the term of a singular expression should be understood to include a multiple expression as well as the singular expression if there is no specific definition in the context. Also, even though the terms such as "about" or "virtually" are not used when explaining the shape, size comparison and position relation, it should be understood that the general error range is included. Even though the terms of "~after", "~before", "subsequently", "then", "at this time" or "hereinafter", it should be understood that these terms are not used for the time limitation. If using the term such as "the first" or "the second", it is to separate any one element from other elements selectively, alternately or repetitively, that is, a scope of claims is not limited by these terms. Also, if it is mentioned that a first element is positioned "on or above" a second structure, it should be understood that the first and second elements may be brought into contact with each other, or a third element may be interposed between the first and second elements. However, if using "right on or right above", it should be understood that the first and second elements are brought into contact with each other. All terms including technical or scientific terms have the same meaning which could be understood by those skilled in the art if there are no specific definitions. Also, the generally-used terms such as the terms defined in the dictionary should be understood to be the contextual meaning in the art, wherein the generally-used terms are not the ideal and formal meanings if there are no specific definitions.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
a first substrate;
at least one pixel over the first substrate;
a first power line over the first substrate, the first power line supplying a first voltage to the pixel;

a second power line over the first substrate, the second power line supplying a second voltage to the pixel, the second voltage being different from the first voltage; and a second substrate over the first substrate, the second substrate including a first metal layer, a second metal layer, and an insulating layer between the first metal layer and the second metal layer, the insulating layer insulating the first metal layer and the second metal layer from each other, wherein the first metal layer is electrically connected with the first power line and the second metal layer is electrically connected to the second power line.

2. The organic light emitting display device according to claim 1, wherein the first metal layer is electrically connected to the first power line through a first conductive medium and the second metal layer is electrically connected to the second power line through a second conductive medium.

3. The organic light emitting display device according to claim 2, wherein a size of the first conductive medium is different than a size of the second conductive medium.

4. The organic light emitting display device according to claim 1, wherein a distance between the second metal layer and the first substrate is greater than a distance between the first metal layer and the first substrate, and wherein a length of the second metal layer is longer than a length of the first metal layer along a first direction.

5. The organic light emitting display device according to claim 1, wherein a portion of at least one of the first metal layer or the second metal layer includes a metal protrusion that protrudes toward the first substrate, or
wherein a portion of at least one of the first power line or the second power line includes a protrusion that protrudes respectively toward either the first metal layer or the second metal layer.

6. The organic light emitting display device according to claim 5, wherein the metal protrusion of either the first metal layer or the second metal layer and the protrusion of either the first power line or second power line is in direct contact, respectively, to electrically connect together either the first metal layer and the first power line or the second metal layer and the second power line.

7. The organic light emitting display device according to claim 5, wherein the metal protrusion of either the first metal layer or the second metal layer is respectively in direct contact with either the first power line or the second power line, respectively, to electrically connect together either the first metal layer and the first power line or the second metal layer and the second power line.

8. The organic light emitting display device according to claim 1, wherein the first metal layer includes at least one open area which removes a predetermined portion of the first metal layer, and
wherein the second metal layer is electrically connected with the second power line of the first substrate through the at least one open area.

9. The organic light emitting display device according to claim 8, wherein the open area is not visible from a plane view of the organic light emitting display device.

10. The organic light emitting display device according to claim 1, wherein a length of the first metal layer is longer than a length of the second metal layer along a first direction.

11. The organic light emitting display device according to claim 10, wherein a contact area between the first metal layer and the first power line of the first substrate is in a direction of the length of the first metal layer.

12. The organic light emitting display device of claim 2, further comprising:
a sealing layer between the first substrate and the second substrate, the sealing layer covering the first conductive medium and the second conductive medium.

13. The organic light emitting display device of claim 1, wherein the second substrate further includes a first power transfer line and a second power transfer line over the second substrate, and wherein the first metal layer is connected with the first power line to electrically connect together the first power line and the first power transfer line through the first metal layer, and wherein the second metal layer is connected with the second power line to electrically connect together the second power line and the second power transfer line through the second metal layer.

14. An organic light emitting display device comprising:
a first substrate;
at least one pixel over the first substrate;
a power line over the first substrate, the power line supplying a voltage to the pixel; and
a second substrate over the first substrate, the second substrate including a metal layer and a power transfer line between the first substrate and the second substrate, the power transfer line connected to the metal layer;
wherein the metal layer is connected to the power line to electrically connect together the power transfer line and the power line.

15. The organic light emitting display device according to claim 14, further comprising:
a conductive medium including a first end and a second end, the first end in direct contact with the metal layer and the second end in direct contact with the first substrate, the conductive medium electrically connecting together the power transfer line and the power line through the metal layer.

16. The organic light emitting display device according to claim 15, wherein the metal layer includes a metal protrusion that protrudes toward the first substrate.

17. The organic light emitting display device according to claim 16, wherein the first end of the conductive medium is in direct contact with the metal protrusion of the metal layer.

18. The organic light emitting display device according to claim 14, wherein the metal layer includes a metal protrusion that protrudes toward the first substrate, the metal protrusion in contact with the power line to electrically connect together the power transfer line and the power line through the metal layer.

19. The organic light emitting display device according to claim 14, wherein the metal layer includes a metal protrusion that protrudes toward the first substrate and the power line includes a protrusion that protrudes towards the metal layer, the metal protrusion of the metal layer in direct contact with the protrusion of the power line to electrically connect together the power transfer line and the power line through the metal layer.

20. The organic light emitting display device of claim 14, further comprising:
a sealing layer between the first substrate and the second substrate, the sealing layer covering the conductive media.

* * * * *